United States Patent [19]
Mowry

[11] Patent Number: 4,891,725
[45] Date of Patent: Jan. 2, 1990

[54] MAGNETORESISTIVE SENSOR HAVING ANTIFERROMAGNETIC EXCHANGE-BIASED ENDS

[75] Inventor: Greg S. Mowry, Burnsville, Minn.

[73] Assignee: Magnetic Peripherals Inc., Minnetonka, Minn.

[21] Appl. No.: 221,479

[22] Filed: Jul. 19, 1988

Related U.S. Application Data

[63] Continuation of Ser. No. 15,203, Feb. 17, 1987, abandoned.

[51] Int. Cl.⁴ .................................................. G11B 5/39
[52] U.S. Cl. .................................................... 360/113
[58] Field of Search ............... 360/113, 110, 119, 121; 338/32 R; 324/252

[56] References Cited

U.S. PATENT DOCUMENTS

| | | | |
|---|---|---|---|
| 3,887,944 | 6/1975 | Bajorek et al. | 360/113 |
| 3,975,772 | 8/1976 | Lin | 360/113 |
| 4,103,315 | 7/1978 | Hempstead et al. | 360/110 |
| 4,556,925 | 12/1985 | Suenaga et al. | 360/113 |
| 4,639,806 | 1/1987 | Kisa et al. | 360/113 |
| 4,663,685 | 5/1987 | Tsang | 360/113 |
| 4,713,708 | 12/1987 | Krounbi et al. | 360/113 |
| 4,771,349 | 9/1988 | Tsang | 360/113 |

FOREIGN PATENT DOCUMENTS

| | | | |
|---|---|---|---|
| 0024017 | 2/1980 | Japan | 360/113 |
| 0015226 | 1/1982 | Japan | 360/113 |

OTHER PUBLICATIONS

Bajorek et al., "Modified Magnetoresistive Head", IBM TDB, Oct. 1970, vol. 16, No. 5, p. 1372.

Gangulee et al., "Deactivation of Magnetic Material Beneath Conductor Leads in Magnetoresistive Sensor Structures", IBM TDB, Jun. 1976, vol. 19, No. 1, pp. 356–357.

*Primary Examiner*—Stuart N. Hecker
*Assistant Examiner*—David J. Severin
*Attorney, Agent, or Firm*—Edward P. Heller, III; Kinney & Lange

[57] ABSTRACT

An elongated magnetoresistive sensor strip longitudinally biased to maintain a single domain sense region by exchange-biasing material atomically coupled to the strip at the ends of the strip outside of a central sense region.

13 Claims, 7 Drawing Sheets

STEP 1

STEP 2

STEP 3

STEP 4

STEP 5

MAGNETORESISTIVE SENSOR HAVING ANTIFERROMAGNETIC EXCHANGE-BIASED ENDS

This is a continuation of co-pending application Ser. No. 015,203 filed on 02/17/87, now abandoned.

BACKGROUND OF THE INVENTION

1. Field of the Invention

The invention relates to the field of magnetoresistive sensors and more particularly to magnetoresistive heads for magnetic disk drives.

2. Brief Summary of the Prior Art

Magnetoresistive sensors responsive to a change in resistivity caused by the presence of magnetic fields are increasingly employed as read transducers in the heads of magnetic disk drives primarily because the change of resistivity is independent of disk speed, depending only on the magnetic flux and secondarily because sensor output may be scaled by the sense current.

These sensors typically comprise a thin strip of NiFe alloy (Permalloy) magnetized along an easy axis of low coercivity. Many other ferromagnetic alloys are also candidates. The strips are usually mounted in the head such that the easy axis is transverse the direction of disk rotation and parallel to the plane of the disk. The magnetic flux from the disk causes rotation of the magnetization vector of the strip, which in turn causes a change in resistivity to a sense current flowing between lateral contacts. The resistivity varies approximately according to the cosine-squared of the angle between the magnetization vector and the current vector (i.e., delta-rho=rho-max * cosine-squared theta, where theta is the angle between the magnetization and current vectors and rho is the resistivity). Due to this cosine-squared relationship, if the magnetization and current vectors are initially aligned, the initial change in resistivity due to disk magnetic flux is low and undirectional. Typically, therefore, either the easy axis magnetization vector or the current vector is biased to approximately 45° to increase responsiveness to angular change in the magnetization vector and to linearize the sensor output.

One problem encountered with magnetoresistive sensors is Barkhausen noise caused by the irreversible motion of magnetic domains in the presence of an applied field, i.e., coherent rotation of the magnetization vector is non-uniform and suppressed, and depends upon domain wall behavior. This noise mechanism is eliminated by creating a single magnetic domain in the sense current region of the strip.

Many different means have been employed to both linearize the sensor output and to provide for a single domain in the sense region. An increase in the length of a strip of magnetoresistive material relative to its height is known to contribute to formation of a single magnetic domain in the central portions of the strip. These migrate toward the center under the influence of external fields. However, long strips may be subject to cross-talk in lateral portions of the strip and may conduct magnetic flux from adjacent tracks to the sense region of the strip. Short strips, in contrast, almost invariably spontaneously "fracture" into multiple domains.

Efforts have been made to provide single domains in the sensor region by shaping the strip so as to reduce edge demagnetizing fields while providing a relatively short physical dimension in the sensor region. See e.g., Kawakami et al. U.S. Pat. No. 4,503,394, at FIG. 4a, wherein upper and lower horizontal sections with opposed easy axes are connected at the ends with vertical sections to comprise an endless loop. See also, U.S. Pat. No. 4,555,740 in which the strip has two intermediate, upwardly extending legs. However, even shaped strips "fracture" into multiple domains in the presence of strong transverse magnetic fields caused by the inductive write poles between which the magnetoresistive sensors are conventionally mounted (the poles act as soft-magnetic shields to isolate the sensor from magnetic fields not directly adjacent to the sensor).

Efforts have also been made to form single domains by providing a longitudinal magnetic field in "long" or shaped strips, prior to reading. Such a magnetic field has to be strong enough to cause the formation of a relatively stable, single domain in the central sensor region. This initialization field is generally provided by a barber pole, which is also used to cant the direction of the sense current relative to the easy axis magnetic vector.

For short strips, efforts have been made to maintain single domains by permanent longitudinal biasing from adjacent permanent magnets or atomically coupled antiferromagnetic material which results in exchange biasing. Such biasing means are also provided in some applications to transverse-bias the magnetic vector away from the easy axis to linearize the sensor output, as mentioned above.

Both of these biasing schemes (initialization and permanent) have the drawback in that the biasing magnetic field could adversely affect the information prerecorded on the magnetic disk, and further, a permanent biasing field (both transverse and longitudinal) increases the effective anisotropy of the sensor thereby decreasing sensitivity to disk magnetic flux. The barber pole (canted current) design has the additional disadvantage that the effective length of the sensor area is less than the longitudinal distance between the sensor contacts. The barber pole design also requires precise lithographic processes to apply the canted contacts and shorting stripes.

Exchange-biasing is not commonly used in practice because of the presence of two dissimilar materials (the magnetoresistive material and the antiferromagnetic material) at an exposed interface. This can lead to corrosion which can destroy a head. Further, because exchange biasing is a quantum-mechanical ineraction effect, reliable atomic interaction is a must, but such processing is difficult and yields are low. Further, the effect has a strong temperature dependence, being substantially reduced in the typical operating environments of conventional disk drives.

SUMMARY OF THE INVENTION

The invention comprises a series of incremental improvements which address the several problems of prior magnetoresistive heads and leads either alone, or in combination, to an improved head. This disclosure is common to several co-pending applications, each claiming individual improvements which combine to form an improved magnetoresistive sensor and head.

These improvements include shaping the strip in the form of a pseudo-ellipse. This shape has a very stable single domain in the central sense region of the strip. Next exchange biasing antiferromagnetic material may be atomically coupled to the ends of an arbitrarily-shaped strip for the purpose of maintaining the central region in a single domain state. Due to the quantum-mechanical effect of the exchange material, the material does not have to cover the entire ends of the strip, but may be recessed away from the exposed interface region reducing the susceptability to corrosion. Once stability has been established via the pseudo ellipsoid shape and/or boundary control exchange stabilization, only two canted contacts are needed to change current direction for the purpose of linearzing the MR sensor. This completely eliminates the need for any barber poles for stabilizing a domain state and reduces the number of electrical contacts to only two—the sense contacts—because barber poles are no longer needed.

The canted current design is further improved by patterning the strip to cant the easy axis of the strip relative to the horizontal plane of the magnetic disk and correspondingly relaxing the angular cant of the contacts. This leads a greater effective longitudinal sense region.

Further, transverse biasing may be eliminated entirely in coded digital applications where the location of data rather than its magnetic strength or direction is important by operating the sensor in its non-linear mode. While reducing the dynamic range to a small extent, zero crossing determinations from the derivative of the sensed read signals are improved by the increased slope of the non-linear response. Finally, the sensor is preferably located to outside of the inductive write gap to avoid the deleterious effect of multiple domain formations caused by the strong magnetic fields present during write operations. An additional gap structure is added having a broad central shield/pole to shield an elongated magnetoresistive sensor while providing good write/read characteristics.

DESCRIPTION OF THE PREFERRED EMBODIMENT

Figure 1:
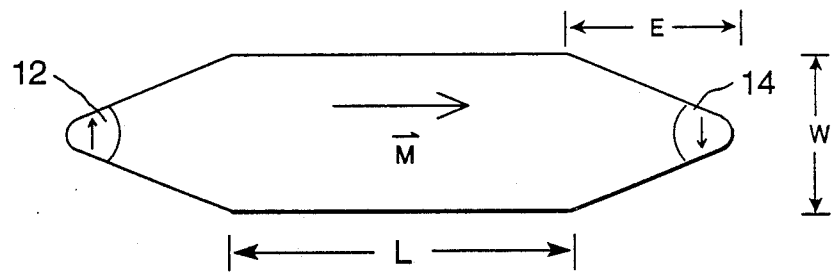
FIG. 1 is an elevation of a pseudo-ellipsoid magnetoresistive sensor strip.

FIG. 1 shows the pseudo ellipsoid structure of a magnetoresistive sensor 10 magnetized along an easy axis M. The central portion, indicated by L, has relatively flat sides, rather than curved as in a true ellipse. The aspect ratio, AR of overall length to height is less than 3, but can be greater with no loss of effect. From the central region L, the sides converge to apices in which small magnetic domains 12 and 14 spontaneously form. Preferably $W \leq L$ and E, the length of an end, is on the order of L at a minimum, having no known maximum. The direction forms a very stable central region single domain indicated by the large right arrow.

Experimentation with this structure shows that a thin layer of 200–500 angstroms NI: 82 Fe: 18 alloy, with an overall length of 25 microns, an L portion of 9 microns, and a width W of 8 microns requires 35 Oe to switch the magnetization vector of the central region to the hard axis, while only 0.75 Oe is required in an unpatterned bulk film. This translates to a factor of 46 improvement.

Where high transverse fields can be expected, such as when an unshielded sensor is placed between or next to the poles an inductive write head, longitudinal biasing is still required to initialize or maintain a single domain state. As hitherto discussed, there are many different means for accomplishing this. For example, barber pole biasing generates a longitudinal field. In addition permanent magnetic biasing or exchange biasing can also provide a longitudinal field. A novel stabilization means is disclosed in FIG. 2.

Prior exchange stabilization/biasing techniques have been typically prepared by first depositing a ferromagnetic layer upon a substrate and then depositing an antiferromagnetic layer upon the ferromagnetic layer such that after patterning, the two layers coincide.

Exchange biasing can result in a signal loss due to shunting effects. Longitudinal exchange fields have a negative temperature dependence. And finally, the possibility exists of corrosion due to bimetallic film structure.

The domain stabilization process can be understood by recognizing that if the magnetization is somehow pinned at the boundaries of a thin film strip then the equilibrium magnetization direction can be controlled in the central region between the boundaries. By depositing FeMn in the hatched regions shown in FIG. 2, the previously indicated drawbacks to standard exchange-biasing techniques can be avoided. First, since there is no exchange material in the central active region, there can be no signal loss due to current shunting. Secondly, this stabilization technique is extremely temperature insensitive since the requirement is made that only the direction of the magnetization be fixed; not the magnitude of the longitudinal exchange field. And finally, by proper patterning, the bimetallic interface can be eliminated at any exposed edge.

In the preferred embodiment, the exchange biasing material is FeMn because it is electrically conductive.

Figure 2:
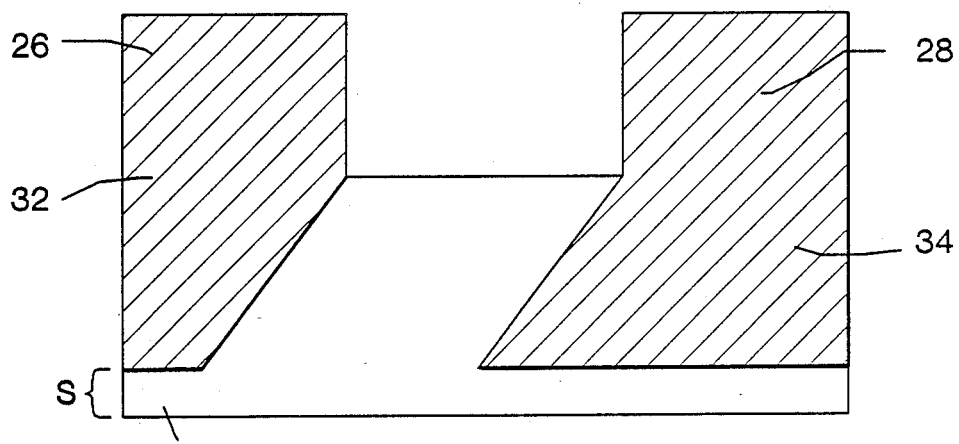
FIG. 2 is the strip of FIG. 1 having exchange-biasing material at the ends.

An embodiment having a stable single-domain central region employing exchanged-biased ends is shown in FIG. 2. Here, the strip has a C shape with a relatively narrow central region and with the lateral ends having upwardly extending legs 26 and 28 for conducting the demagnetizing field further away from the central region. This improves the stability of single domains in the central region. Exchange bias material 32, 34 and contact metallization (not shown in the figure) are applied to these ends using the process next described in the pattern shown in the Figure, which generally conforms to the pattern of canted current end contacts (not shown) to be applied later. This pattern of exchange material eliminates edge and end domains and provides a stable central single domain sense region. To avoid the aforementioned corrosion problem at exposed interfaces, the resist pattern is so shaped as to provide a recess S of between the exchange material and the lower edge of the strip 10, the edge exposed to the magnetic disk in most designs.

Figure 3:
FIG. 3 illustrated the essential steps for depositing exchange-biased only on the ends of a magnetoresistive strip.
Figure 3:
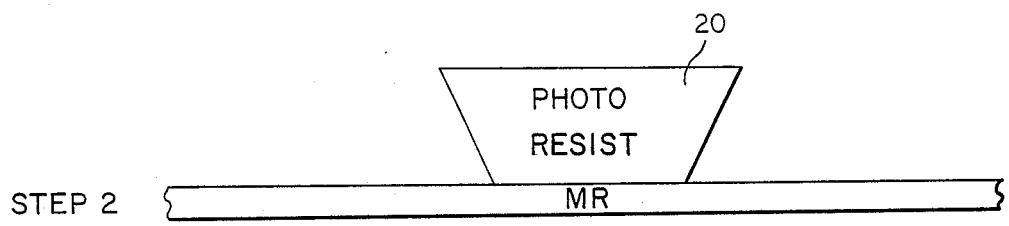
Figure 3:
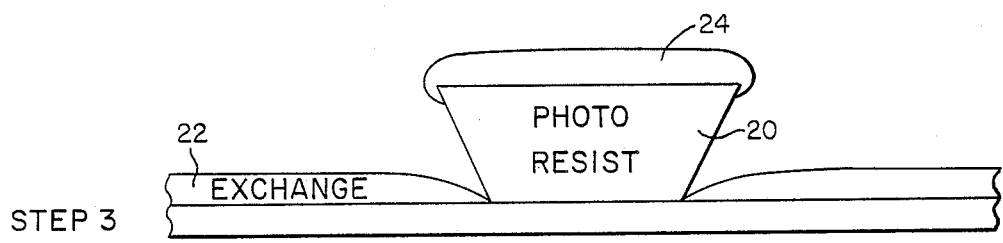
Figure 3:
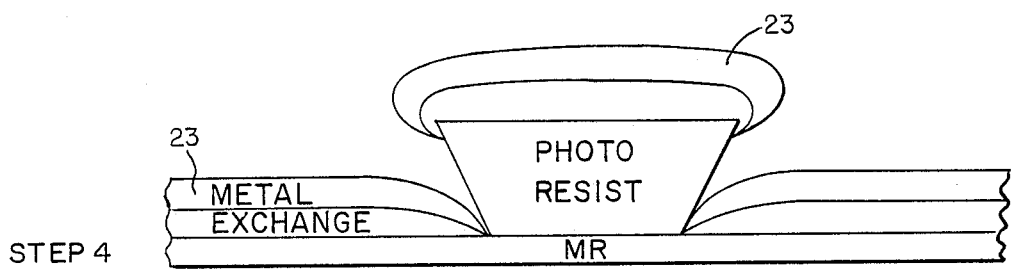
Figure 3:
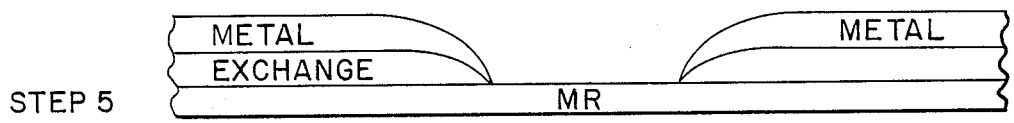

The process for forming the structure shown in FIG. 2 is shown in FIG. 3. Step 1, a strip of magnetoresistive material is evaporated, sputtered or the like on a substrate, not shown for the purpose of clarity, in a uniform magnetic field directed along an easy axis and patterned. Step 2: A photo resist layer is laid down and patterned using conventional processes to form an island resist layer 20 with inwardly inclined sides. Step 3: Next the exchange material 22 is evaporated, sputtered or the like onto the combination. Step 4: deposit contact metallization 23. Step 5: Using a lift-off process, the resist, exchange material 24 and metal 23 clinging to it are removed.

Figure 4:
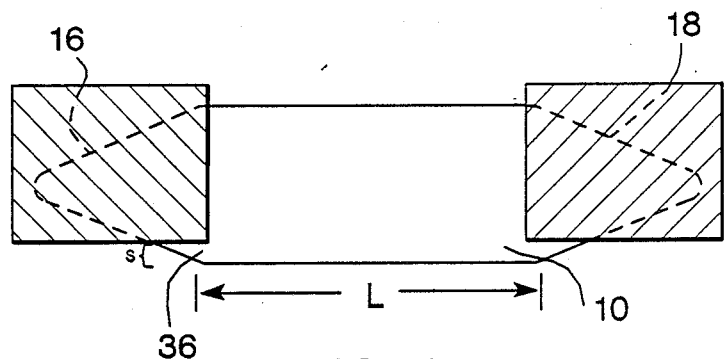
FIG. 4 is an elongated magnetoresistive strip having upwardly projecting ends with exchange-biased material at the ends.

FIG. 4 shows a pseudo-ellipsoid strip with exchange material on its ends extending to the flattened central region L. A similar recess S 36 should be provided.

Figure 5:
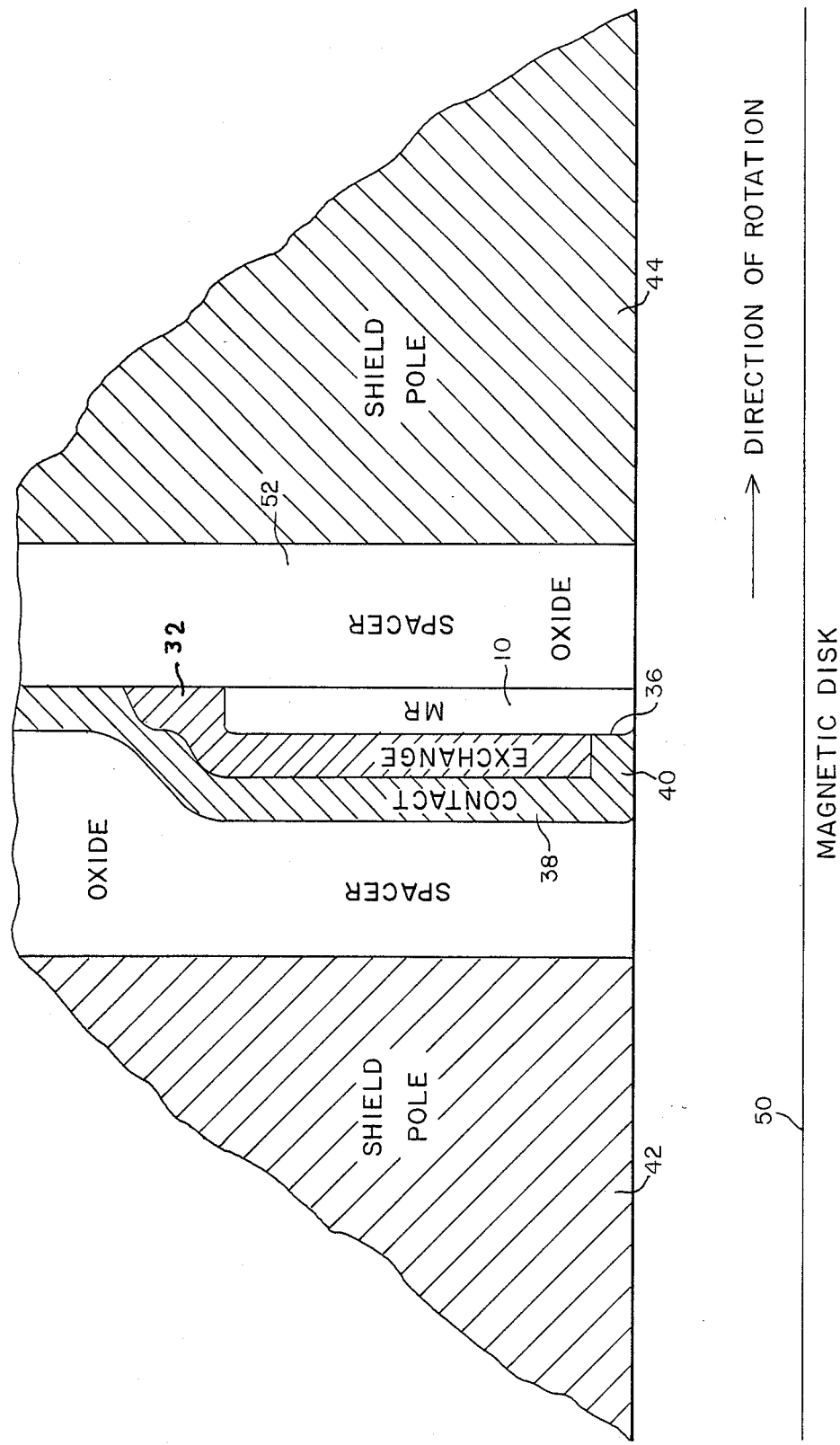
FIG. 5 is a cross section of a magnetoresistive head having a magnetoresistive sensor with recessed exchange-biased material.

FIG. 5 shows a cross section of the exchange-biased strip 10 of either FIG. 2 or 4 mounted between shields 42 and 44 of a typical head above a magnetic disk 50. In the Figure, the exchange material 32 is recessed a short distance 36 above the head surface and the contact metal 38 has a leg 40 extending to the strip 10 and shielding the exchange material 32 from exposure. At least one of the shields 42 and 44 also comprise one of the poles of an inductive write apparatus. The shields are separated via spacers 52 typically composed of a non magnetic material such as $Al_2O_3$. By providing the recess 36, the contact 38 has a leg 40 directly contacting the magnetoresistive material 10. This shields the exchange material 32 from exposure. Most heads land on the disk surface 50 when disk rotation stops, burnishing small amounts of head material away. The amount of recess verses the degree of burnishing determines the lifetime of the head until the exchange material is exposed leading to potential corrosion.

Figure 6:
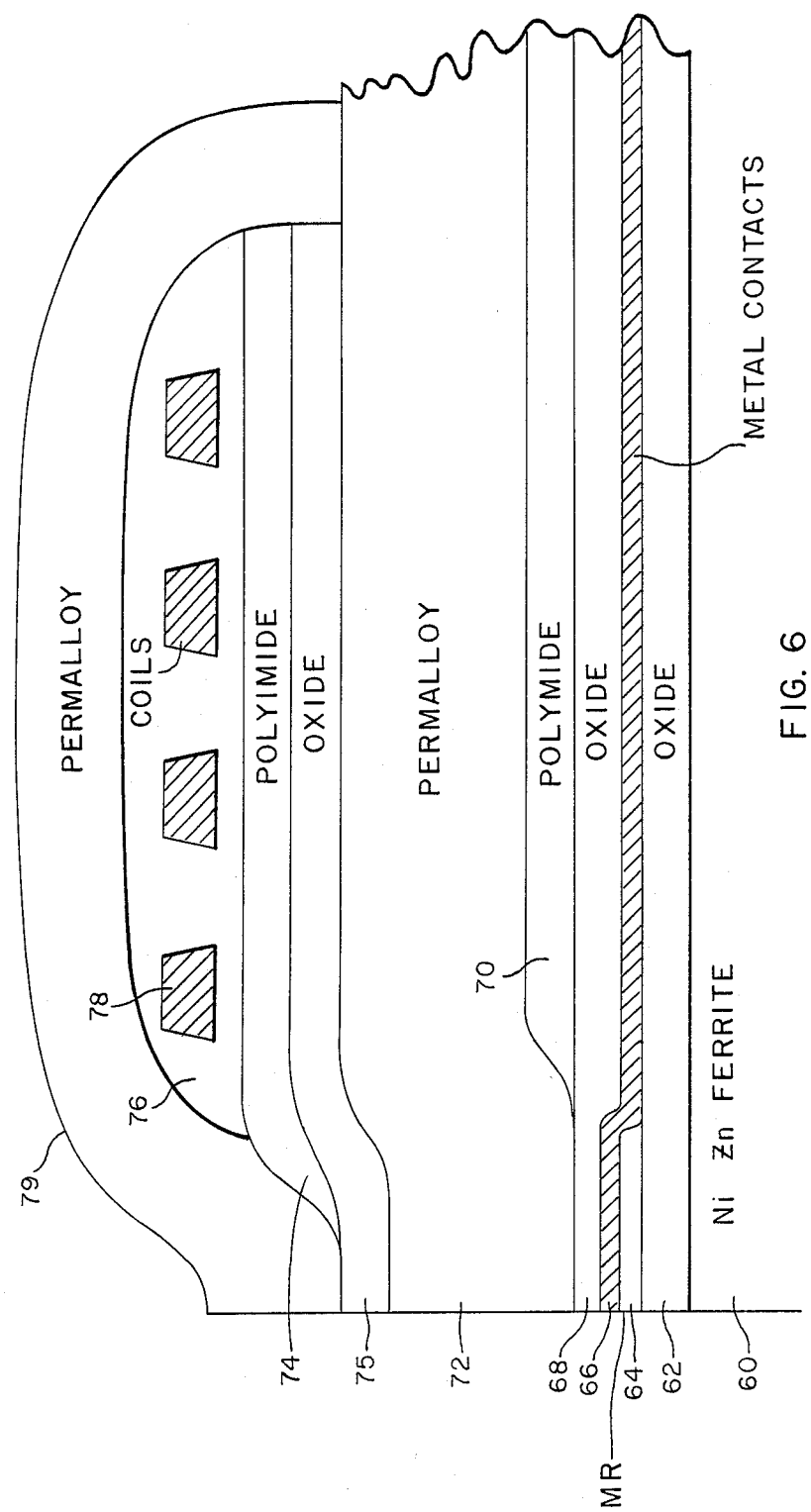
FIG. 6 shows the layer structure of a double-gap magnetoresistive head.
Figure 7:
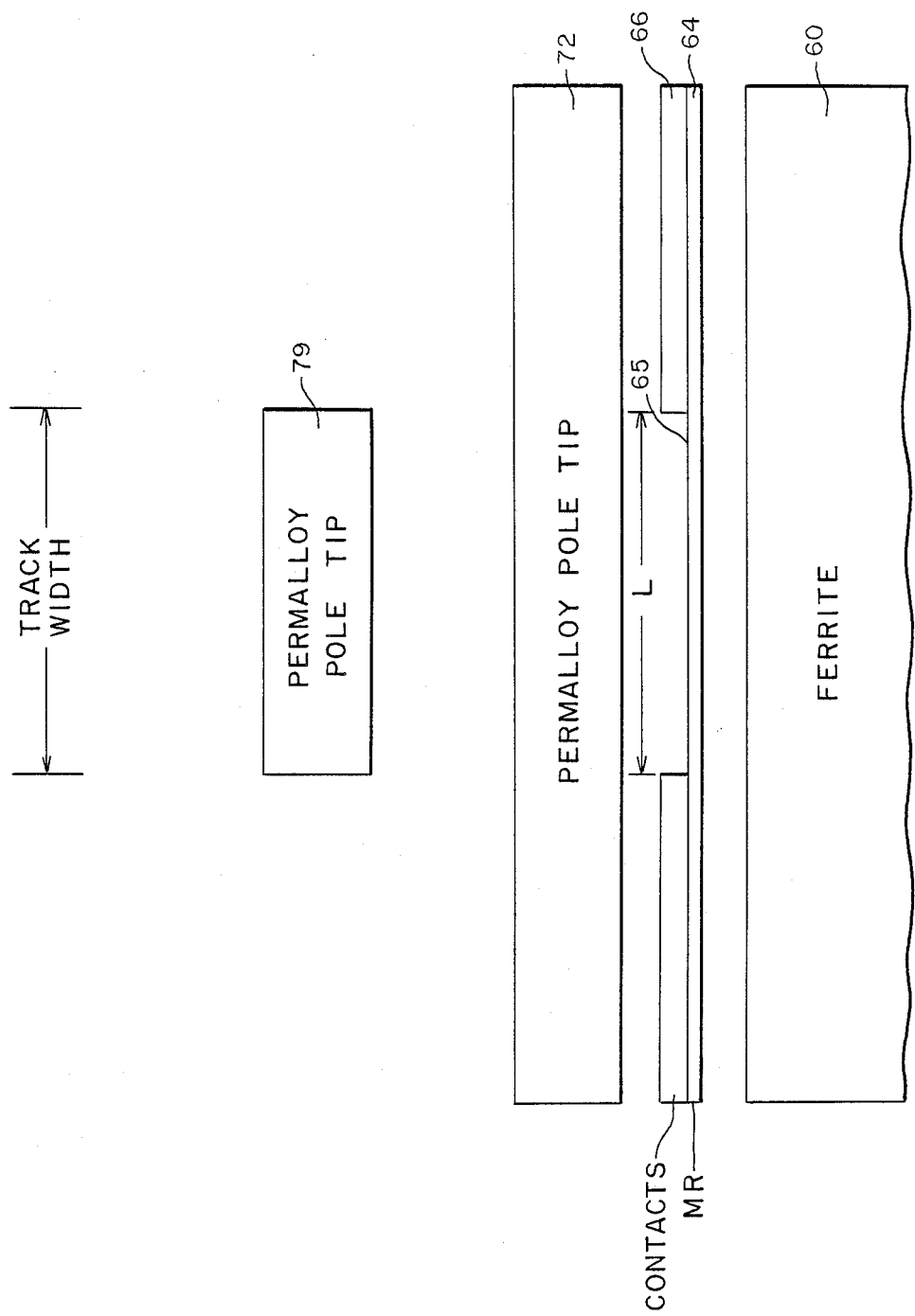
FIG. 7 is an elevation view of the essential elements of a double-gap magnetoresistive head.

The existence of strong transverse magnetic fields causes relatively stable single domain regions to "fracture" into multiple domains, the source of Barkhausen noise. Strong magnetic fields are present between the pole tips of an inductive write apparatus, the conventional location of most magnetoresistive heads. To reduce affect of the inductive write pole tips on the magnetoresistive head, it is known to place the head along side the inductive write pole tips. See e.g., Lee, U.S. Pat. No. 4,321,641. This type of structure requires a soft-magnetic shield, a shield/trailing pole tip, and a leading pole tip. The design of this patent is not entirely satisfactory, primarily due to the extension of the MR material 76, 78 (see FIG. 4 or 7 of '641) beyond the shield of the trailing pole tip 90. The design of FIGS. 6 and 7 provide a very magnetically quiet region for the magnetoresistive sensor. The residual flux from the magnetic poles of the inductive write transducer is so low as to permit the reliable operation of very stable, shaped, single-domain sensors (e.g., the pseudo-ellipse 10 of FIG. 1) without longitudinal biasing.

FIG. 6 is a cross section of the essential elements of the improved design. A layer of oxide, preferably aluminum oxide 62 is deposited upon a soft-magnetic substrate 60, preferably NiZn. Next, the magnetoresistive sensor material 64 is deposited in a magnetic field and patterned. (Exchange biasing material may then be deposited and patterned if desired). Metal contacts 66 are then deposited on the magnetoresistive strip 64. A second layer of oxide 68 is then deposited. These two oxide layers, 62 and 68, comprise the read gap. A layer of polyimide or photo resist 70 is then deposited and patterned as shown to remove the layer adjacent the gap end of the head. Next a layer of ferromagnetic material 70 is laid down, preferably NiFe (Permalloy). This layer 70 comprises the trailing pole/shield. Next, a write gap oxide, 75 (aluminum oxide or silicon dioxide), is deposited followed by a second layer of polyimide or photo resist 74. Metal coils 78 are deposited and patterned. Two layers of polyimide or photo-resist 76 are deposited and patterned to remove the portion not adjacent the coils 78. And finally, a final layer of a ferromagnetic material 79 is deposited to encompass the coils and contact the other ferromagnetic layer 72 to form a continuous flux path. After the package is formed, it is typically sealed in a suitable non magnetic material and the gap end processed (usually lapped) to expose the gap(s) and provide a reliable gap height.

FIG. 7 is an end view of the essential elements of the double gap head of the preferred embodiment. Spacing layers are omitted for clarity. Shown in the Figure are the ferrite substrate 60, the magnetoresistive strip 64, its lateral metal contacts 66 defining a central sensor region 65 of length L, and the ferromagnetic trailing pole/shield 72, and the leading pole 79. The length of the leading pole 79 defines the written track width via magnetic mirroring with the trailing pole/shield as shown in the Figure. This length corresponds to the length L (plus a processing guard band wherein the length L is intentionally made smaller than the written track width to avoid possible cross talk) of the central region 65 of the magnetoresistive strip 64. Typically, the magnetoresistive strip is longer than a track width to assist in providing a stable central region single domain. It is essential that the trailing pole/shield 72 be as long as the magnetoresistive sensor 64 to completely shield it from side fringing fields originating during the writing process. This makes the lead and trailing poles 79, 72 of different lengths. But it has been discovered that this does not affect the written track width, which is defined by the length of the leading pole 79 and the above mentioned mirroring effects.

For many applications, such as audio, linear operation of a magnetoresistive sensor is desirable. As mentioned above, linearization either requires the canting of the easy axis magnetization vector or the canting of the current vector. Canting of the magnetization vector typically increases anisotropy and reduces the range of resistivity change and thus sensitivity of the sensor. Canting the current likewise causes a comparable loss in sensitivity as better illustrated in FIG. 8.

Figure 8:
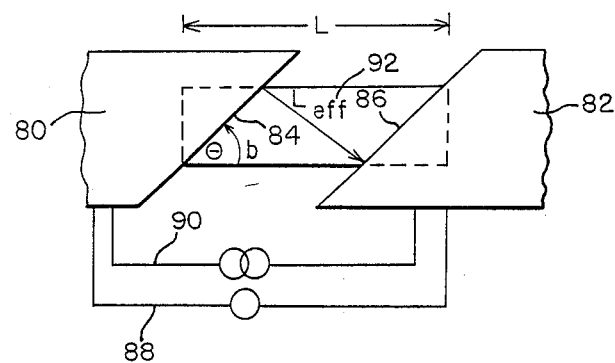
FIG. 8 shows the prior art canted current contacts and electrical circuits connected thereto.

FIG. 8 shows a typical canted current biasing technique wherein conductors 80, 82, intimately contacting a magnetoresistive strip 92 of length L provide a canted current from a source 88 generally in the direction $L_{eff}$ between the contacts. The current direction is generally perpendicular to the surfaces 84, 86 of the contacts. These surfaces are generally canted at an angle theta sub B of between 40 and 45 degrees for greatest linearity and sensitivity. The change in resistivity is sensed by means 90 (which can be a voltage sensor if 88 is a constant current source, a transimpedance current sensor if 88 is a constant voltage source, or a power sensor if 88 is a "soft" source). The change is resistivity is generally proportional to the length $L_{eff}$, which by inspection, is less than the length L between the contacts in the longitudinal direction. L, in turn, is approximately the track width of narrow track and defines the length of the sense region. Thus, the sensitivity of the device is reduced by the ratio $L_{eff}/L$. Making $L_{eff}$ comparable to track width is not desirable because L would then be long enough to pick up significant cross talk from adjacent tracks.

Figure 9:
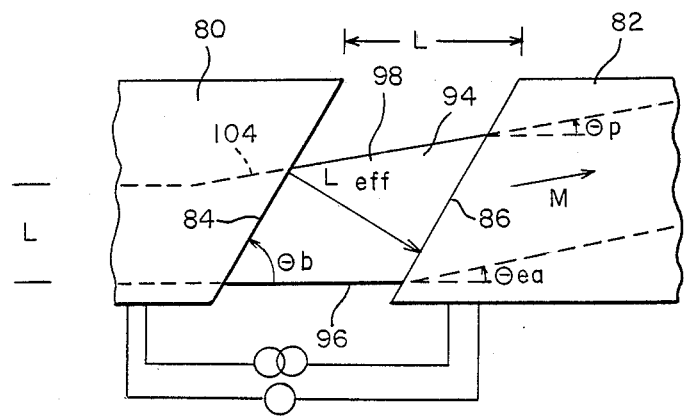
FIG. 9 shows the easy axis pattern-biased strip of the present invention and relaxed canted current contacts.

FIG. 9 shows the improved canted current sensor which relaxes the cant of the contact surfaces 84, 86 to an angle theta sub B' of approximately 50 degrees. This substantially increases $L_{eff}$ and thereby sensitivity while maintaining the approximately 40 to 45 degree angle with the easy axis. The reason for this is that the magnetoresistive strip is patterned such that its easy axis is itself canted by an angle theta sub EA of approximately 10 degrees.

In the Figure, the contact surfaces 84, 86 are each canted at an angle theta sub B' which is preferably 50 degrees. The magnetoresistive strip's lower edge 96 is parallel to the magnetic disk surface as in the prior art, but the upper edge 98 is patterned at an angle theta sub P thereto to give a resultant easy axis magnetization vector M at an angle theta sub EA of approximately 10 degrees with the lower edge.

The strip 94 is formed from a bulk film deposited on a suitable substrate in an uniform magnetic field directed parallel to the lower edge 96. The bulk film is thereafter patterned using conventional lithographic techniques to form the pattern illustrated with the upper edge forming an upwardly extending angle with the lower edge. This shape inherently cants the easy axis magnetization vector upwards, though to a lesser degree than the angle of the upper edge. To achieve the net easy axis rotation of 10 degrees, the designer will have to balance the strength of the undeflected easy axis vector with the size, length, thickness, and composition of the magnetoresistive material with the degree of upward edge angle.

Figure 10:
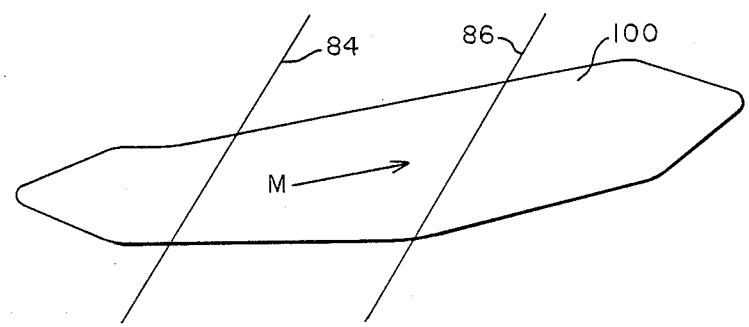
FIG. 10 shows an easy axis, patterned-biased pseudo-ellipsoid magnetoresistive strip.

In the preferred embodiment, the strip 94 is composed of 80:20 NiFe alloy, approximately 500 angstroms thick, with L approximately equal to 9 microns, h (the height of the sensor at point 104) approximately equal to 8 microns, and theta sub P is 10 degrees, where theta sub B' is 50 degrees and theta sub EA is 10 degrees. FIG. 10 shows an example of a canted easy axis psuedo-ellipsoid 100 and its relative orientation with contact surfaces 84 and 86 (the balance of the contacts are not shown in the Figure.

for most digital applications, data is written on the disk in code (e.g., variable length 2,7) where only the location of a transition (pulse peak) rather than its direction and magnitude is important. Pulse amplitude serves the function of triggering qualifiers to discern between signal and noise. Thus except for improved initial sensitivity to magnetization vector rotation, there is no good reason to operate the sensor linearly. Thus the final improvements to the magnetoresistive sensor are to provide no transverse biasing at all, except perhaps the patterned biasing just described, operate the sensor in a non linear mode and design the magnetoresistive sensor and disk flux such that the magnetization vector rotation in response to disk flux is on the order of 40 to 50 degrees.

Because the location of a transition (pulse peak) is important, the signal from the disk is conventionally differentiated and the zero crossing detected. Noise makes the location of the zero crossing uncertain, and for this reason, noise ultimately limits the data density. However, by not biasing the sensor, the sensor will operate in its non linear mode (see the equation in the Description of the Prior Art) and the differential will have a steeper zero crossing slope than that of a linearly biased sensor. This increased zero-crossing slope leads to less sensitivity to noise, and to a more accurate detection of zero crossing locations, all other things being equal.

Figure 11:
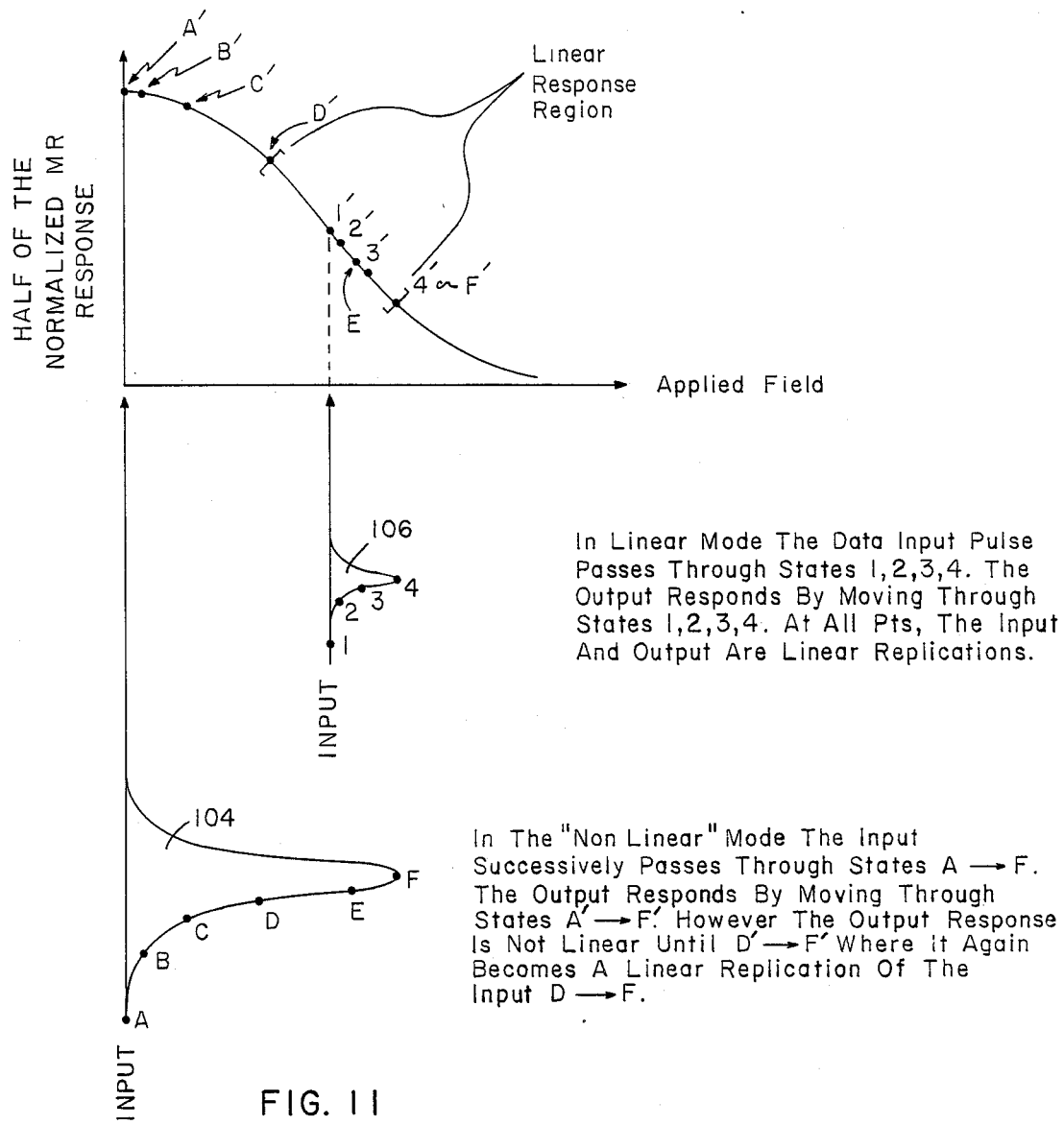
FIG. 11 shows the relative response of a magnetoresistive sensor in linear and non-linear modes.

In order to achieve a proper non linear signal out of the sensor, the magnetization vector must be made to rotate to a greater degree than in the biased case, see FIG. 11 for an illustration of the principle. The upper portion of the Figure graphs half of the normalized magnetoresistive response (the cosine-squared equation previously mentioned). The lower portions of the Figure graph two disk flux input signals, the left 104 represent the input signal to a non linear magnetoresistive sensor, the right the input to a linear magnetoresistive sensor. While the two signals are shown with greatly different magnitudes, they may actually be the same magnitude if the relative response of the magnetoresistive sensor is proportional to the relative difference shown. Actually, it may be preferable to adjust the relative response of both the disk and the sensor.

In a linear mode of operation, the input pulse 106 passes through states 1, 2, 3, and 4 and the sensor responds by moving through resistivity states 1', 2', 3' and 4' (for an oppositely polarized pulse, the states would be on the opposite side of 1'). For all states, the inputs and outputs are linear replications.

In a non linear mode, the input signal 104 passes through states A→F and the sensor responds with states A'→F' (an oppositely polarized signal pulse would result in the same output, but from the other half of the resistivity curve.) The output is non linear until region D'→F', where it again becomes a linear replication of the input.

It can be seen from the Figure that the total response of the non linear sensor (from A' to F') is greater than the total response from the linear sensor (from 1' to 4'). Thus total sensitivity is greater, and transition centers (pulse peaks) can be more accurately located. Actual sensor output is increase by 25 to 30%.

While there are many possible choices of materials to achieve the response indicated in FIG. 11, the preferred choice is a sensor comprised of permalloy and a magnetic disk material with sufficient flux to yield the magnetization vector rotation indicated with a head mounted on a conventional flyer.

Figure 12:
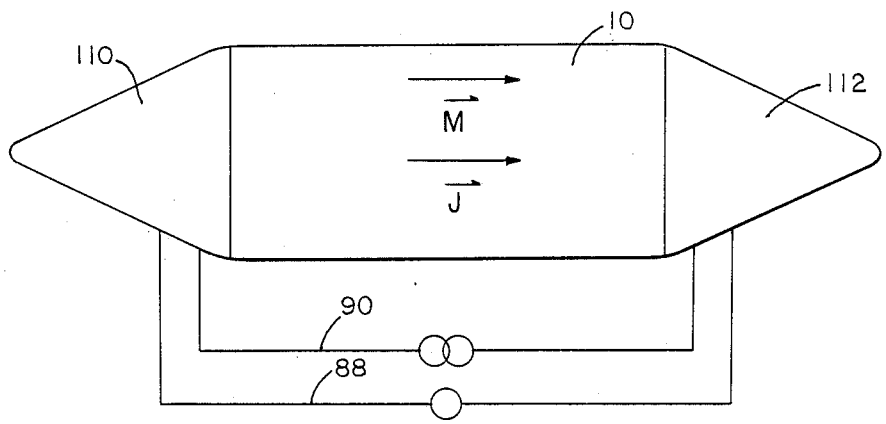
FIG. 12 is a pseudo-ellipsoid magnetoresistive sensor having uncanted contacts for a non-linear response.

FIG. 12 shows the preferred magnetoresistive sensor comprised of a pseudo-ellipsoid 10, uncanted contacts 110 and 112, a constant current source 88, a voltage sensor 90. This sensor is preferably mounted in the double gap head of FIGS. 6 and 7. By providing no biasing whatever, the sensor operates in a non linear mode. Its shape and location in the shielded second gap of the double gap head maintains the sensor in a single domain state. If this implementation is not robust enough for a given application, then stability can be further enhanced by providing for exchange material in contact regions 110 and 112 as previously described.

I claim:

1. An elongated magnetoresistive sensor strip having a sense region and exchange-biasing antiferromagnetic material exchange-coupled to the magnetoresistive sensor strip only outside the sense region, the sense region being stabilized in a single magnetic domain state through exchange interaction outside the sense region.

2. The strip of claim 1 wherein the strip is mounted in the head of a disk drive with the strip oriented substantially vertical to the surface of at least one of the drives' disks, the strip having a bottom edge facing said surface, and wherein said exchange-biasing material is recessed a short distance away from said bottom edge.

3. The strip of claim 1 wherein the strip has a longitudinal section in which the sense region is centrally located further comprising a pair of vertically extending sections coupled to the longitudinal section outside the sense region.

4. The strip of claim 3 wherein the strip is mounted in the head of a disk drive with the strip oriented substantially vertical to the surface of at least one of the drives' disks, the strip having a bottom edge facing said surface, and wherein said exchange-biasing material is recessed a short distance away from said bottom edge.

5. A shaped magnetoresistive sensor strip having a stable single-domain in a single central sense region and exchange-biasing antiferromagnetic material exchange-coupled to the sensor only outside the central sense region, the central sense region being stabilized in the stable single-domain by exchange interaction outside the central sense region.

6. The strip of claim 5 wherein the strip is mounted in the head of a disk drive with the strip oriented substantially vertical to the surface of at least one of the drives' disks, the strip having a bottom edge facing said surface, and wherein said exchange-biasing material is recessed a short distance away from said bottom edge.

7. The strip of claim 5 wherein the strip has a longitudinal section in which the central sense region is centrally located further comprising a pair of vertically extending sections coupled to the longitudinal section outside the central sense region.

8. The strip of claim 7 wherein the strip is mounted in the head of a disk drive with the strip oriented substantially vertical to the surface of at least one of the drives' disks, the strip having a bottom edge facing said surface, and wherein said exchange-biasing material is recessed a short distance away from said bottom edge.

9. The strip of claim 5 wherein the strip has a pseudo-ellipsoid shape.

10. The strip of claim 9 wherein the strip is mounted in the head of a disk drive with the strip oriented substantially vertical to the surface of at least one of the drives' disks, the strip having a bottom edge facing said surface, and wherein said exchange-biasing material is recessed a short distance away from said bottom edge.

11. A magnetoresistive sensor comprising:
    an elongated thin film layer of electrically conductive, magnetoresistive material having boundary regions;
    antiferromagnetic material exchange-coupled with at least a portion of the boundary regions;
    a central sensing region in the elongated layer defined within the boundary regions by the substantial absence of exchange-coupled antiferromagnetic material; and
    a single magnetic domain state in the central sensing region stabilized through exchange-coupling at the boundary regions.

12. A magnetoresistive sensor as set forth in claim 11 wherein the elongated layer of electrically conductive, magnetoresistive material has a geometric shape promoting stabilization of a single domain magnetic state in the elongated layer.

13. A magnetoresistive sensor as set forth in claim 11 wherein the elongated layer is mounted in the head of a disk drive with the elongated layer oriented substantially vertical to the surface of at least one of the drive's disks, the strip having a bottom edge facing said surface, and wherein said exchange-biasing material is recessed a short distance away from said bottom edge.

* * * * *